United States Patent
Kramer et al.

(10) Patent No.: US 8,519,494 B2
(45) Date of Patent: Aug. 27, 2013

(54) METHOD FOR MANUFACTURING A MICROMECHANICAL DIAPHRAGM STRUCTURE HAVING ACCESS FROM THE REAR OF THE SUBSTRATE

(75) Inventors: Torsten Kramer, Wannweil (DE); Marcus Ahles, Pfullingen (DE); Armin Grundmann, Reutlingen (DE); Kathrin Knese, Reutlingen (DE); Hubert Benzel, Pliezhausen (DE); Gregor Schuermann, Reutlingen (DE); Simon Armbruster, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 177 days.

(21) Appl. No.: 12/737,037

(22) PCT Filed: Apr. 21, 2009

(86) PCT No.: PCT/EP2009/054698
§ 371 (c)(1),
(2), (4) Date: Feb. 28, 2011

(87) PCT Pub. No.: WO2009/149980
PCT Pub. Date: Dec. 17, 2009

(65) Prior Publication Data
US 2011/0147864 A1    Jun. 23, 2011

(30) Foreign Application Priority Data
Jun. 10, 2008 (DE) .......... 10 2008 002 332

(51) Int. Cl.
*G01P 15/08* (2006.01)
(52) U.S. Cl.
USPC ............ 257/417; 257/418; 257/419

(58) Field of Classification Search
CPC .... B81B 1/00; H01L 21/30608; G01L 9/0042
USPC .................... 257/417, 418, 419
See application file for complete search history.

(56) References Cited

U.S. PATENT DOCUMENTS

| | | | |
|---|---|---|---|
| 2002/0094435 A1* | 7/2002 | Artmann et al. | 428/332 |
| 2005/0199973 A1 | 9/2005 | Benzel et al. | |
| 2006/0057755 A1 | 3/2006 | Weber | |
| 2006/0237806 A1* | 10/2006 | Martin et al. | 257/415 |
| 2010/0133630 A1* | 6/2010 | Scheuerer et al. | 257/417 |
| 2010/0164023 A1* | 7/2010 | Knese et al. | 257/415 |

FOREIGN PATENT DOCUMENTS

| | | |
|---|---|---|
| DE | 10 2004 036 035 | 7/2005 |
| DE | 10 2004 015 444 | 9/2005 |

(Continued)

*Primary Examiner* — Jerome Jackson, Jr.
*Assistant Examiner* — Paul Budd
(74) *Attorney, Agent, or Firm* — Kenyon & Kenyon LLP (57) ABSTRACT

A method for manufacturing a micromechanical diaphragm structure having access from the rear of the substrate includes: n-doping at least one contiguous lattice-type area of a p-doped silicon substrate surface; porously etching a substrate area beneath the n-doped lattice structure; producing a cavity in this substrate area beneath the n-doped lattice structure; growing a first monocrystalline silicon epitaxial layer on the n-doped lattice structure; at least one opening in the n-doped lattice structure being dimensioned in such a way that it is not closed by the growing first epitaxial layer but instead forms an access opening to the cavity; an oxide layer being created on the cavity wall; a rear access to the cavity being created, the oxide layer on the cavity wall acting as an etch stop layer; and the oxide layer being removed in the area of the cavity.

8 Claims, 12 Drawing Sheets

(56) References Cited

FOREIGN PATENT DOCUMENTS

| DE | 10 2005 042 648 | 3/2007 |
| DE | 10 2006 024 668 | 11/2007 |
| EP | 1 167 934 | 1/2002 |
| WO | WO 2009/127455 | 10/2009 |

* cited by examiner

METHOD FOR MANUFACTURING A MICROMECHANICAL DIAPHRAGM STRUCTURE HAVING ACCESS FROM THE REAR OF THE SUBSTRATE

BACKGROUND OF THE INVENTION

1. Field of the Invention

The present invention relates to a method for manufacturing a micromechanical diaphragm structure having access from the rear of the substrate, as well as a corresponding semiconductor component.

2. Description of Related Art

In manufacturing sensor elements for measuring relative pressure or differential pressure, access to the diaphragm structure from the rear is usually provided, this access enabling pressure to be applied to both sides of the sensor diaphragm. However, sensor elements for measuring absolute pressure are also provided with rear access for defined applications to apply pressure to the sensor diaphragm. When using an absolute pressure sensor in so-called "harsh environments," this may avoid the front of the chip coming into contact with the measuring medium.

A method for manufacturing a semiconductor component having a diaphragm structure and rear access to this diaphragm structure is described in published German patent application document DE 10 2004 036 035 A1. The known method is based on a p-doped monocrystalline Si substrate. A contiguous, lattice-type area of the substrate surface is initially provided with n-doping. A substrate area beneath the n-doped lattice structure produced thereby is then porously etched, the n-doped lattice structure not being attacked by this etching process. In a subsequent epitaxy process, a closed monocrystalline Si epitaxial layer is then created on the n-doped lattice structure.

In a first variant of the known method, the porous silicon is rearranged during the epitaxy process and a further tempering step in such a way that a cavity is produced beneath the n-doped lattice structure and the epitaxial layer grown thereon.

In a second variant of the known method, a cavity is created beneath the n-doped lattice structure prior to the epitaxy process. In this variant, the cavity wall—as far as it is present prior to the epitaxy process—is protected by a thermal oxide against the growth of silicon material during the epitaxy process. Due to a corresponding process control, the epitaxial layer also grows laterally on the lattice structure, closing the lattice openings and thus also the cavity. These areas of the epitaxial layer complete the cavity wall and are not coated with oxide—according to the process control.

A third variant of the known method provides that the porous silicon beneath the n-doped lattice structure is oxidized to prevent the porous silicon from being rearranged during epitaxy. The cavity in this case is created only after the epitaxial layer is applied, by removing the porous silicon oxide. This may be done either via an access opening, which is subsequently introduced into the epitaxial layer, or via an access hole in the rear of the substrate, which may then also be used as a rear access to the diaphragm structure.

BRIEF SUMMARY OF THE INVENTION

According to the present invention, an improvement on the known method is proposed, which may be used to easily and cost-effectively manufacture micromechanical components having a diaphragm structure and a rear access to this diaphragm structure, maintaining precise manufacturing tolerances.

The method according to the present invention is characterized by the fact that, at least one opening in the n-doped lattice structure is dimensioned in such a way that it is not closed by the growing first epitaxial layer but instead forms an access opening to the cavity;

an oxide layer is created on the cavity wall;

a rear access to the cavity is created, the oxide layer acting as an etch stop layer on the cavity wall; and the oxide layer is removed in the area of the cavity so that a rear access to the diaphragm structure provided above the cavity is produced.

The method according to the present invention is based on a skillful combination of tried-and-trusted surface micromechanical process blocks having a standard etching method for the bulk silicon, starting from the rear of the substrate. An oxide layer on the cavity wall, which has been created using surface micromechanical methods, is used as an etch stop layer during processing of the bulk silicon. In particular, the diaphragm structure is reliably protected against the etching attack on the rear by this oxide layer provided on the underside. Each individual method step of the method according to the present invention may be represented by a known, easily carried out, easily controllable and therefore entirely cost-effective process sequence. In addition, the method according to the present invention offers a high degree of design freedom with regard to the shape and size of the diaphragm structure, it being possible to manufacture this diaphragm structure so that it has a defined thickness and defined dimensions. This may be used to optimize the component structure for various applications.

With the aid of the method according to the present invention, continuous monocrystalline silicon diaphragms having defined material parameters are preferably created. Diaphragms of this type are characterized by a high degree of long-term stability and enable monolithic integration of circuit elements, such as piezoelectric resistors for detecting signals. Since the process steps of the method according to the present invention are CMOS-compatible, the method may be easily supplemented by a process sequence for monolithic integration of an evaluation circuit.

In addition to the manufacturing method, a semiconductor component produced in this way and having a micromechanical diaphragm structure is also claimed, which is provided in a p-doped Si substrate and has a rear access.

Due to the method, the diaphragm structure includes an n-doped lattice structure, on which at least one first epitaxial layer is grown. The manufacturing method according to the present invention also requires the lateral extension of the cavity beneath the diaphragm structure to be larger on all sides than the inlet opening of the rear access into the cavity wall. This structural feature results from the use, according to the present invention, of the oxide layer on the cavity wall as an etch stop layer, regardless of whether the rear access is created by trenching, KOH etching or with the aid of another etching method.

As mentioned above, the method according to the present invention provides that the cavity wall is provided with an oxide layer. According to the present invention, this oxide layer is created only after a first epitaxial layer is grown on the n-doped lattice structure, and together they limit the cavity and form the lowermost diaphragm layer. Therefore, the oxide layer completely covers the underside of the diaphragm. In principle, different oxidation processes may be used within the scope of the method according to the present invention. Thus, the oxide layer may be created on the cavity wall, for example by compliant deposition of silicon oxide on the epitaxial layer. The silicon oxide enters and coats the cavity via the access opening in the epitaxial layer and the n-doped lattice structure. In a particularly advantageous variant of the method according to the present invention, however, the oxide layer is created on the cavity wall by thermal oxidation, the oxygen needed for this purpose entering the cavity via the access opening in the epitaxial layer and the n-doped lattice structure.

If a closed diaphragm structure is to be created, which is necessary for many applications, the access opening in the epitaxial layer must be closed. For this purpose, the oxidation process for producing the oxide layer on the cavity wall may simply be continued until the access opening is closed by an oxide plug. In the event of thermal oxidation, this is relatively time-consuming and energy-inefficient. In an advantageous variant of the method according to the present invention, the access opening is closed by depositing one or even multiple dielectric, polycrystalline or epitaxial (silicon) layers onto the epitaxial layer, for example an additional oxide layer.

As mentioned above, universally monocrystalline silicon diaphragms are advantageous with regard to their mechanical properties as well as with regard to a possible integration of circuit elements. Therefore, according to an advantageous variant of the method according to the present invention, at least one further silicon epitaxial layer, which covers the closed access opening, is created on the first epitaxial layer. The process parameters may be selected in such a way that a polycrystalline area, which is overgrown by monocrystalline silicon, is produced above the closed access opening, or the process parameters may also be selected in such a way that the closed access opening is laterally overgrown by monocrystalline silicon, so that the further silicon epitaxial layer is universally monocrystalline.

In a further variant of the method according to the present invention, the high degree of design freedom is utilized to place the access openings in the n-doped lattice structure and the epitaxial layer growing thereon not in the diaphragm area above the cavity, but rather above channels which empty into the cavity. For this purpose, a cavity and at least one channel emptying into the cavity are created beneath the n-doped lattice structure in the porously etched substrate area, so that at least one access opening is situated above the channel in the lattice structure. This makes it possible to easily create completely monocrystalline diaphragms, which is explained in greater detail below in connection with an exemplary embodiment.

Finally, let it be further noted at this point that the method according to the present invention is not only highly suitable for manufacturing micromechanical relative pressure sensors and absolute pressure sensors, but it is also suitable, for example, for manufacturing micromechanical microphone elements.

DETAILED DESCRIPTION OF THE INVENTION

Figure 1A:
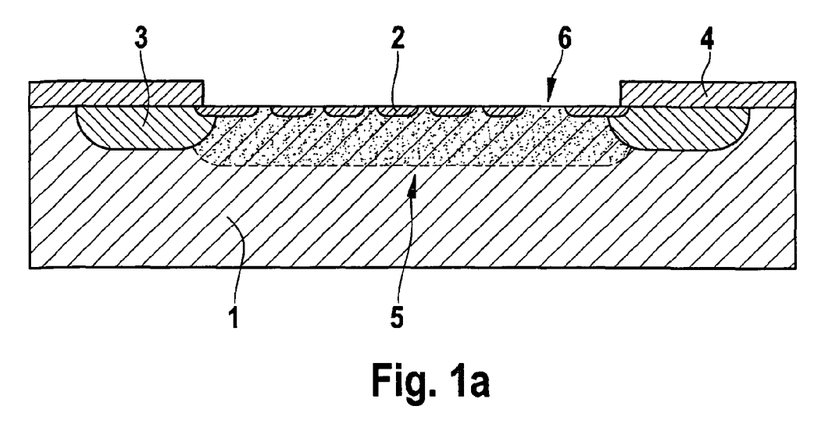
FIGS. 1a-1i illustrate the individual method steps in a first variant of the method according to the present invention, on the basis of schematic sectional views of a first component structure during manufacturing.

The method according to the present invention for manufacturing a micromechanical diaphragm structure having access from the rear of the substrate is based on a p-doped silicon substrate 1. In the method variant illustrated in FIGS. 1a through 1i, an n-doped, contiguous, lattice-type area 2 was initially created in the substrate surface, for example by implantation or diffusion. An $n^+$-doped area 3, which extends further into the depth of substrate 1 and which surrounds the rather superficial lattice-type area 2, was also created. The substrate surface prepared in this way was then provided with an SiN mask 4, which defines the lateral dimensions of a substrate area 5 beneath n-doped lattice structure 2. In a subsequent method step—for example, anodizing the silicon in concentrated hydrofluoric acid—the silicon was porously etched in substrate area 5. The SiN mask protects the substrate surface, in particular in the surrounding area of the diaphragm to be created, which may be used, for example, for monolithic integration of an evaluation circuit. Deep $n^+$-doping 3 on the side forms a lateral etch stop for this etching step. N-doped lattice structure 2 is also not attacked, and it is used as a starting layer for later epitaxy. FIG. 1a shows processed silicon substrate 1 after porous etching of substrate area 5. This FIG. 1a also shows that at least one opening 6 in n-doped lattice structure 2 is designed to be larger than the mesh size determining the nature of the lattice. While the mesh size was selected in such a way that the meshes are closed in a subsequent epitaxy process, the size of opening 6 was determined in such a way that it is not closed by the growing epitaxial layer, but instead forms an access opening to area 5.

Figure 1B:
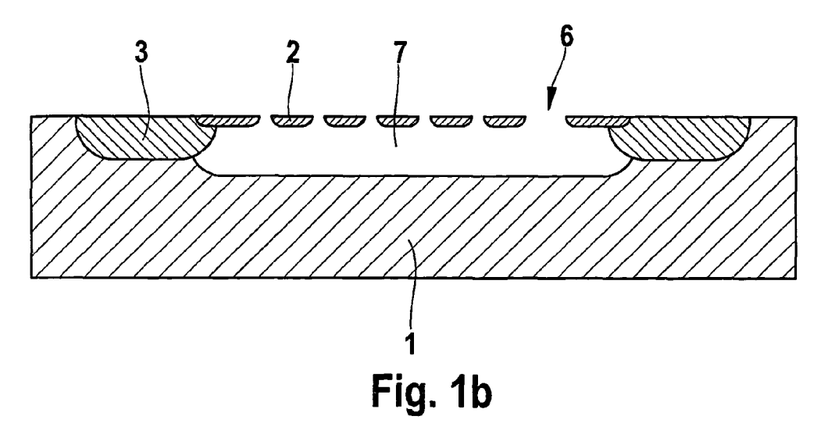

Prior to this epitaxy process, SiN mask 4 was removed from the substrate surface. In addition, a cavity 7 was created in porously etched substrate area 5 beneath n-doped lattice structure 2. For this purpose, the porous silicon may be removed, for example in a wet chemical manner. However, cavity 7 may also be created in a tempering step by thermal rearrangement of the porous silicon. A further option is to produce porous silicon having a porosity of 100% in substrate area 5 right at the beginning via electropolishing. FIG. 1b shows that opening 6 is situated in the area above cavity 7.

Figure 1C:
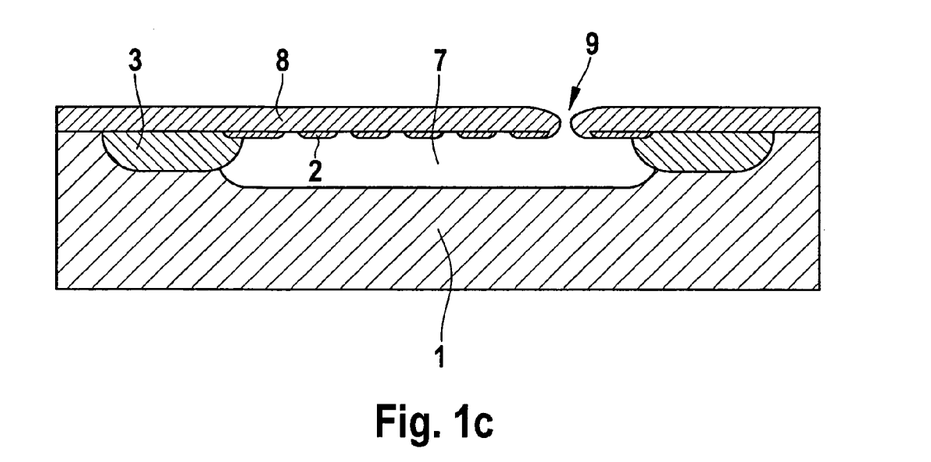
Figure 1D:
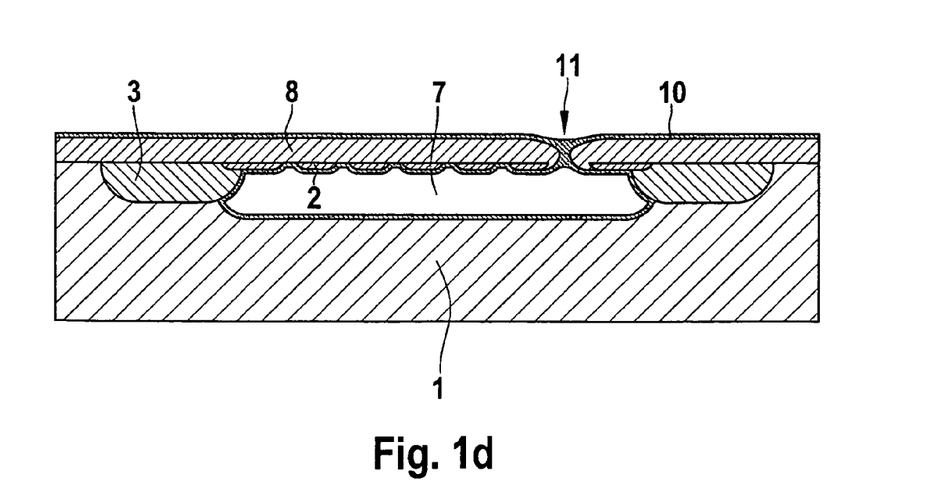

FIG. 1c shows the growing of a first monocrystalline silicon epitaxial layer 8 on n-doped lattice structure 2. The thickness of epitaxial layer 8 is adapted to the mesh size of lattice structure 2 and to the size of opening 6 in that the meshes of lattice structure 2 were overgrown, while opening 6 was not closed. An access opening 9 in epitaxial layer 8 was formed at this point.

According to the present invention, an oxide layer 10 is then created on the cavity wall. This is preferably achieved by thermal oxidation, but it may also be implemented by compliant deposition of silicon oxide on epitaxial layer 8. In this case, the silicon oxide enters and coats cavity 7 via access opening 9. In the exemplary embodiment illustrated here—in particular, see FIG. 1*d*—the oxidation process was continued until access opening 9 was overgrown, so that cavity 7 is closed by an oxide plug 11.

Figure 1E:
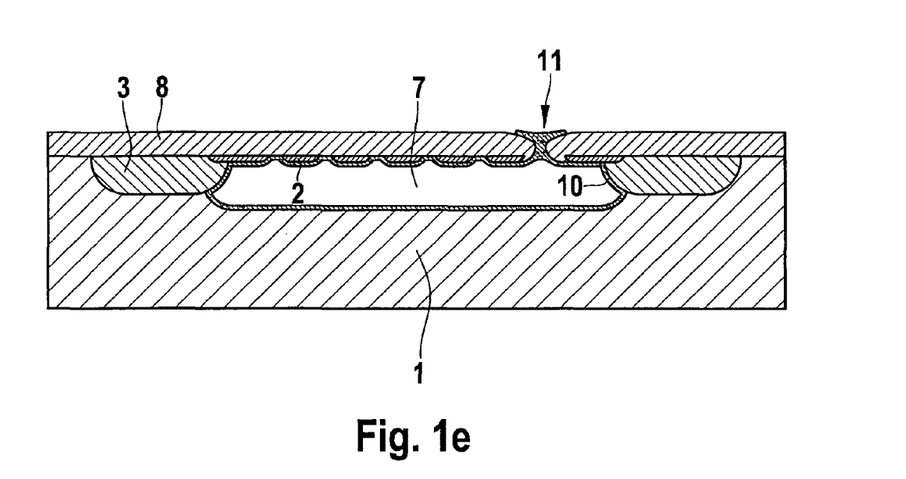

Oxide layer 10 was then removed from the surface of first epitaxial layer 8, as illustrated in FIG. 1*e*. Monocrystalline first epitaxial layer 8 exposed in this way may then be used as a starting layer for a further epitaxial process.

Figure 1F:
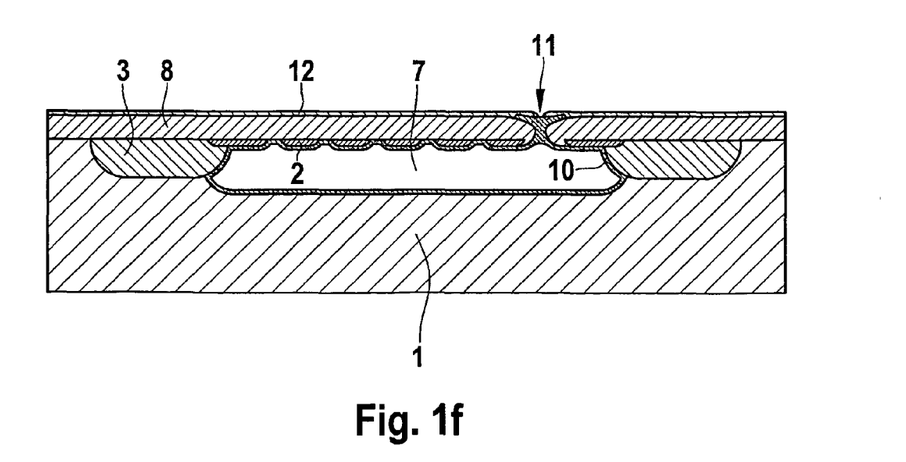
Figure 1G:
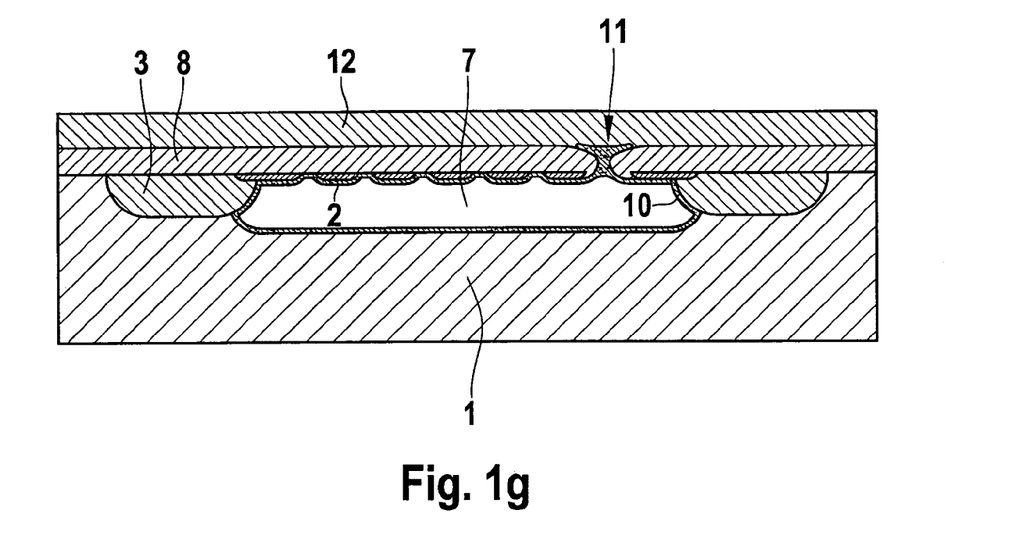

The growth of a second monocrystalline epitaxial layer 12 produced thereby on first epitaxial layer 8 is illustrated in FIG. 1*f* and FIG. 1*g*. The process control in this case is designed in such a way that the production of polycrystalline silicon over oxide plug 11 is avoided. In this case, oxide plug 11 is laterally overgrown in a monocrystalline manner. FIG. 1*f* shows the growth process up to a point in time shortly before the two silicon fronts meet above oxide plug 11. FIG. 1*g* illustrates the progress of the epitaxy process until the complete diaphragm thickness is achieved.

Figure 1H:
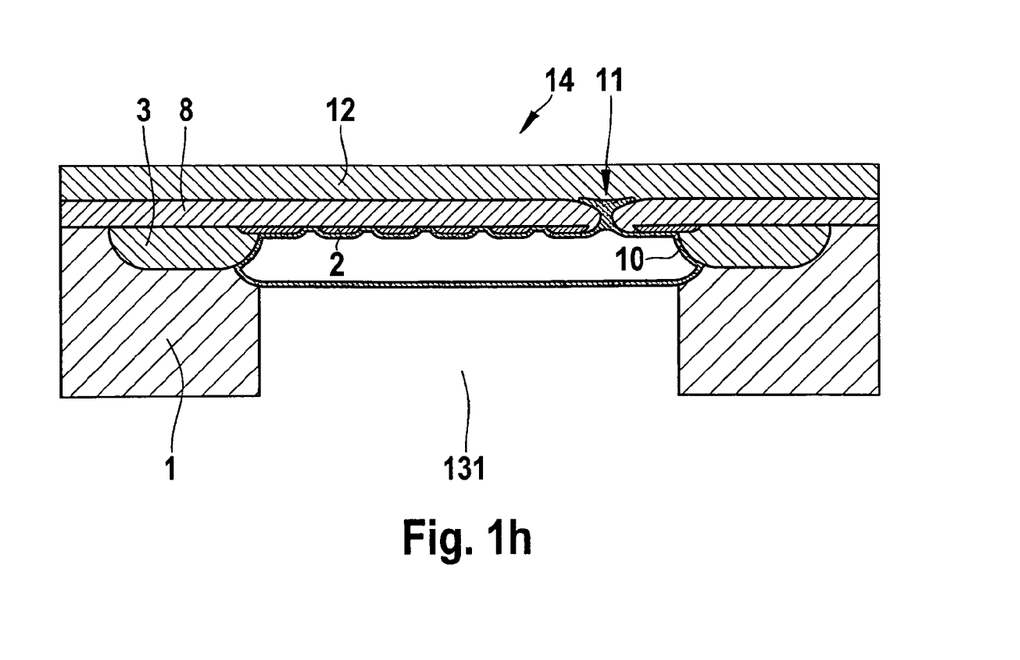
Figure 1I:
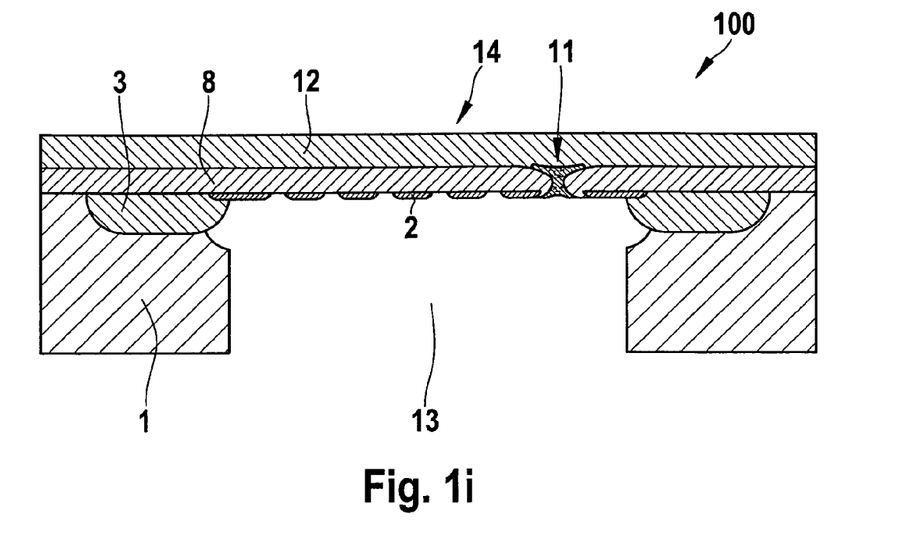

Following these purely surface micromechanical method steps, the rear of the substrate is structured to provide a rear access 13 to cavity 7. According to the present invention, an etching method is used for this purpose, for example trenching or KOH etching, in which oxide layer 10 on the cavity wall acts as an etch stop layer. In the present exemplary embodiment, a trench access 131 is initially created whose lateral extension is correspondingly smaller than the lateral extension of cavity 7. Oxide layer 10 is thus also used for protecting monocrystalline diaphragm 14 above the cavity against through-etching. FIG. 1*h* shows the component structure after the trenching process. Oxide layer 10 is still present in this case. It is not removed until a further process step to finally open rear access 13. This is done starting from the rear of the substrate, for example by HF gas phase etching or in a wet chemical manner. Resulting component structure 100 is illustrated in FIG. 1*i*. As explained above, the lateral extension of the cavity beneath diaphragm structure 14 is larger on all sides than the opening of rear access 13 emptying into the cavity wall, due to the process.

Figure 2:
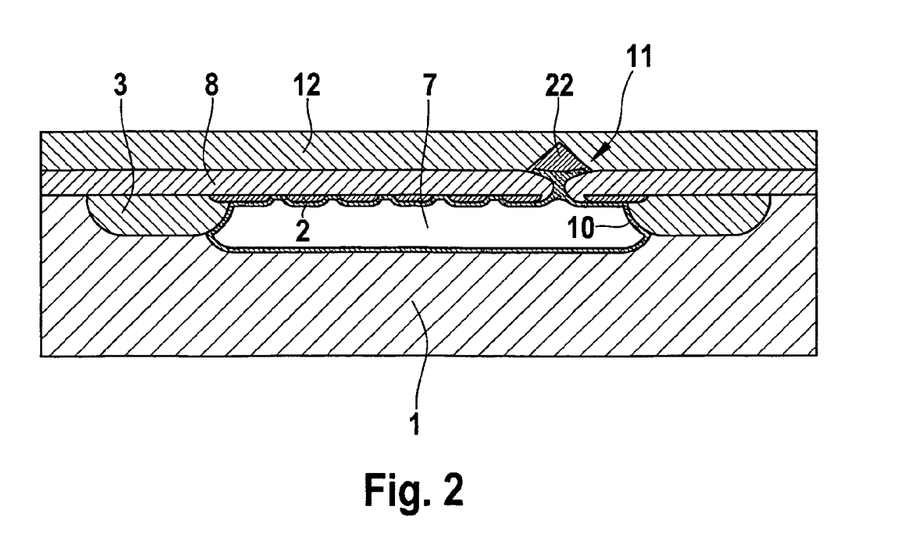
FIG. 2 shows a variant of the method for growing a second epitaxial layer illustrated in FIGS. 1f and 1g.

FIG. 2 illustrates a variant of the process control explained in connection with FIGS. 1*f* and 1*g* for growing a second epitaxial layer 12 on first epitaxial layer 8, in which oxide plug 11 is not exclusively laterally overgrown with monocrystalline silicon. Instead, monocrystalline silicon 12 is first grown on first epitaxial layer 8 as well and polycrystalline silicon 22 is grown on oxide plug 11. However, the process parameters are selected in such a way that the growth rate of the monocrystalline silicon is greater than the growth rate of the polycrystalline silicon. As a result, polycrystalline area 22 continues to decrease in size as the epitaxial thickness increases, until this area is ultimately completely overgrown with monocrystalline silicon, as illustrated in FIG. 2. Alternatively, a polycrystalline Si layer (e.g., start poly) may be deposited over the entire area of the thermal oxide (FIG. 1*d*) in the form of an epitaxial starting layer and subsequently structured together with the oxide over a photolithographic plane.

Figure 3:
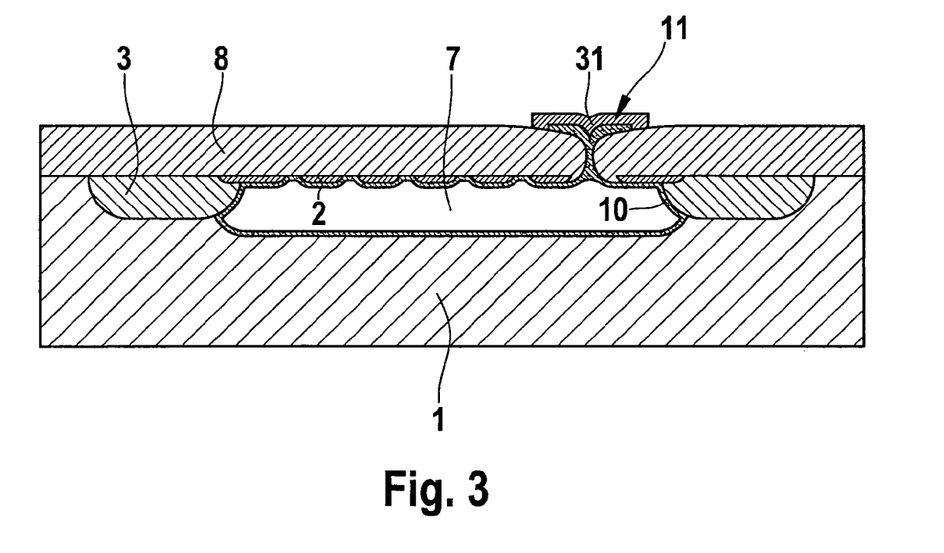
FIG. 3 illustrates a variant of the method shown in FIG. 1, in which a second epitaxial layer is not grown.

A second epitaxial layer 12, as illustrated in FIGS. 1 and 2, is not absolutely necessary to implement a diaphragm closure. This is illustrated by FIG. 3. In this case, the closure of access opening 9 in epitaxial layer 8 is formed exclusively by dielectric or polycrystalline layers, namely by oxide layer 10 and oxide plug 11. This layer was supplemented by a silicon nitride layer 31 to increase the long-term tightness of plug 11 and to protect the oxide against an etching attack during the course of further processing. In this variant, no further epitaxial layer is grown.

Figure 4A:
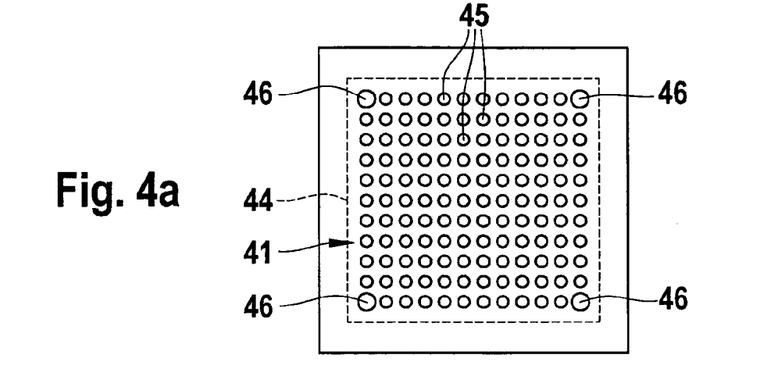
FIGS. 4a-4c illustrate different hole arrangements in the n-doped lattice structure, based on corresponding top views of a silicon substrate.
Figure 4B:
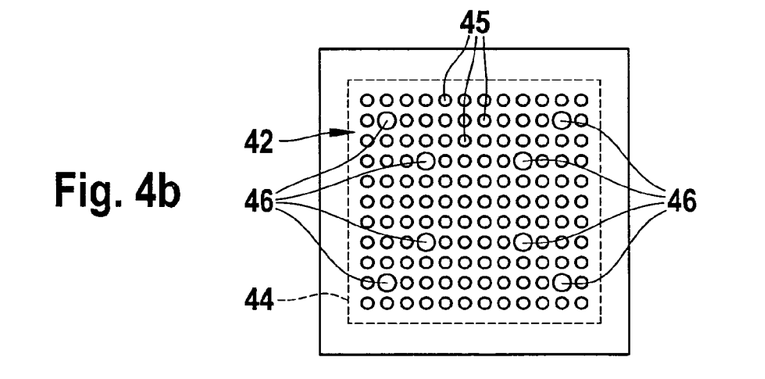
Figure 4C:
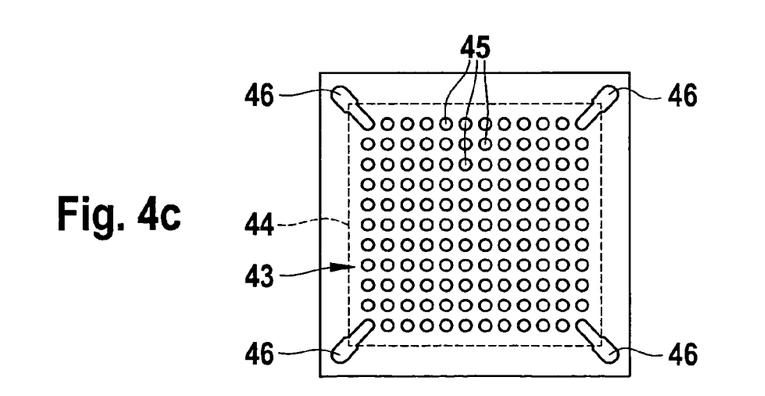

FIGS. 4*a* through 4*c* show three different hole arrangements in three square n-doped lattice structures 41, 42 and 43. The subsequent diaphragm area and cavity area are each indicated by broken line 44. The size of lattice meshes 45 was selected in this case in such a way that they are overgrown in a monocrystalline manner and thus closed in the subsequent epitaxy process. In contrast, larger openings 46 form access openings to the cavity even after this epitaxy process, and these openings are closed only after oxidation of the cavity wall. Lattice meshes 45 may be situated not only in a square pattern, as illustrated here, but also, for example, in a hexagonal, diagonal or centrosymmetrical pattern. Similar degrees of freedom apply to the arrangement of openings 46, and the number of openings 46 may also be selected according to the size and geometry of the diaphragm. Openings 46 are advantageously situated in the corner areas of the diaphragm, since more favorable stress conditions prevail here. Similar considerations apply to other diaphragm geometries.

FIGS. 5 through 9 illustrate a variant of the method according to the present invention, which largely differs from the variant illustrated in FIGS. 1*a* through 1*i* in the shape of the diaphragm and the arrangement of the access openings. This is clarified, in particular, by FIG. 5, which shows a schematic top view of a component structure 500 after the first epitaxial layer has been grown. The square diaphragm area is designated with the reference numeral 501. A cavity 7 is located beneath diaphragm area 501 in the silicon substrate. A funnel-shaped branch channel 60, which was produced by an appropriate design of the n-doped lattice structure and the porous silicon area formed thereunder, and which is illustrated in FIGS. 6 through 9, empties into cavity 7. The area of the epitaxial layer above this branch channel 60 is designated with the reference numeral 502. In the exemplary embodiment illustrated here, access opening 503 is situated at the extended end of this area 502. The consequences and advantages of this arrangement of access opening 503 in the channel area are explained on the basis of sectional views A, B and C in FIGS. 6 through 9.

Figure 5:
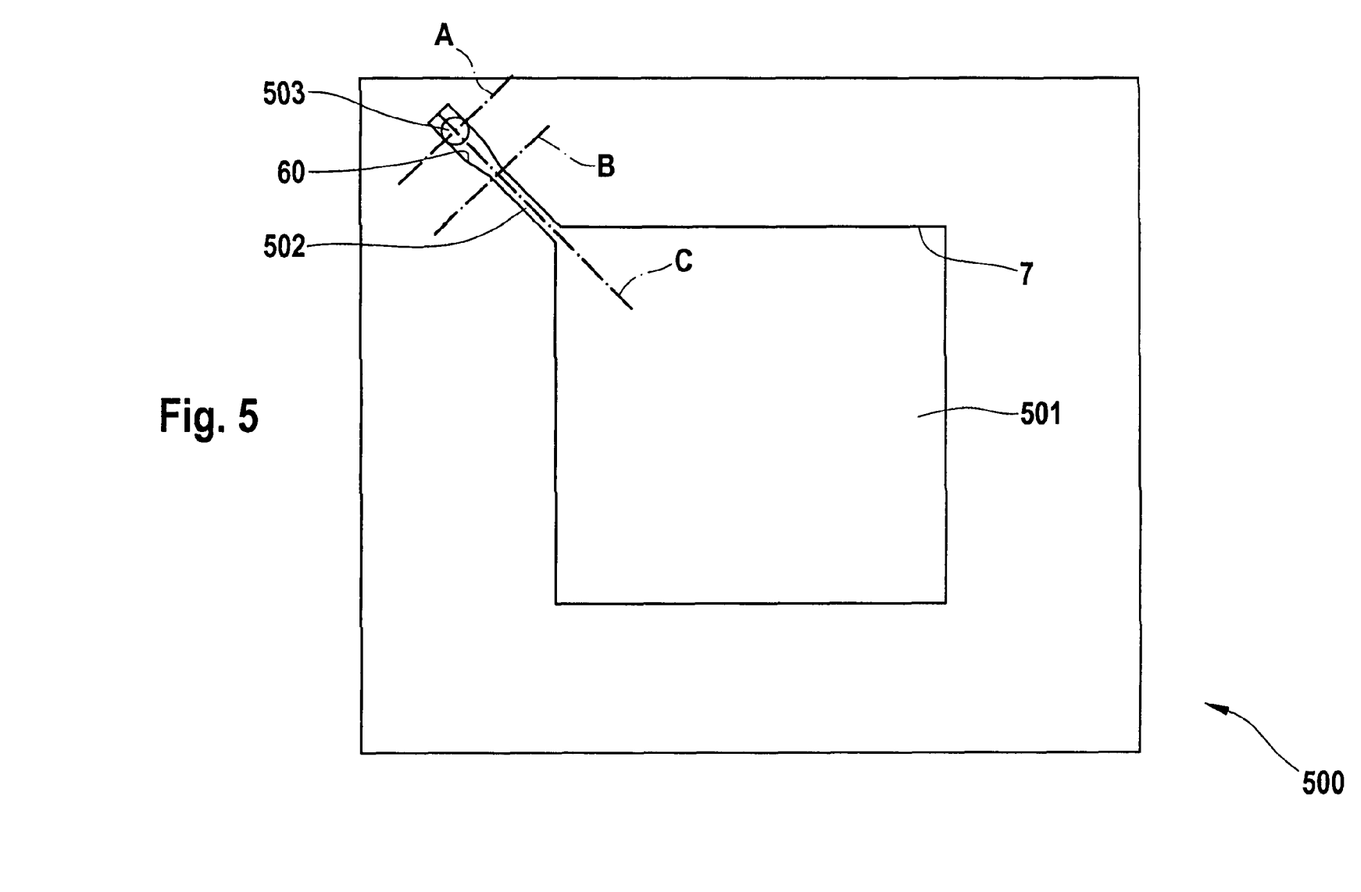
FIG. 5 shows a schematic top view of a component structure after a cavity having a branch channel is created on the component structure and after a first epitaxial layer is grown thereon; this top view includes three sectional axes A, B and C.
Figure 6A:
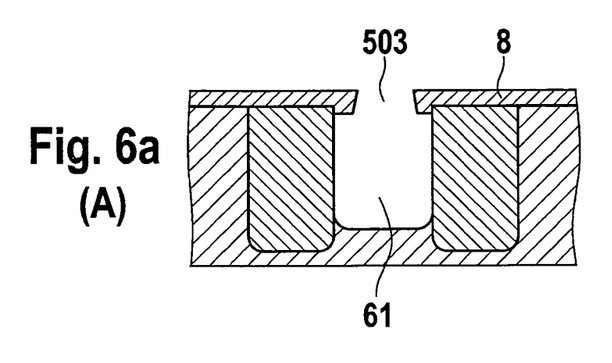
FIGS. 6a-6c each show a sectional representation of the component structure illustrated in FIG. 5 along sectional axes A, B and C, after the first epitaxial layer has been grown.
Figure 6B:
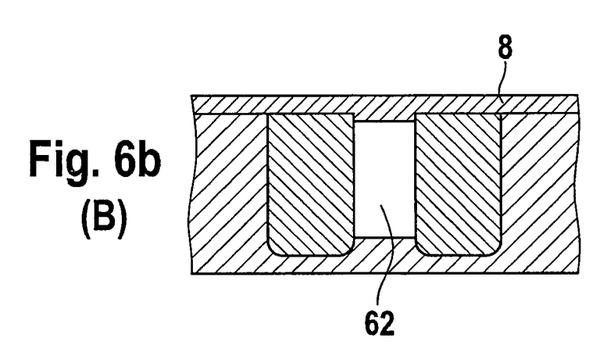
Figure 6C:
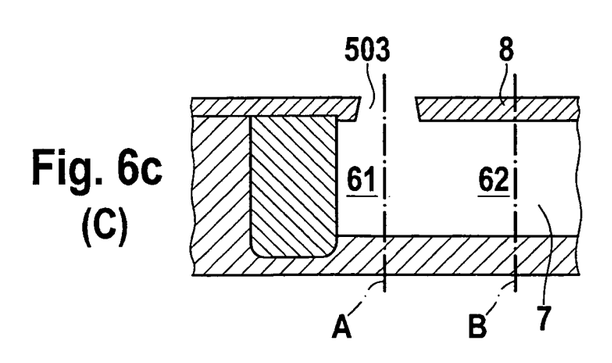

FIGS. 6*a* through 6*c* show component structure 500 in the same method stage as FIG. 5, namely after first epitaxial layer 8 has been grown on the n-doped lattice structure and the surface of the substrate. The lattice meshes of the monocrystalline lattice structure were overgrown in a monocrystalline manner. An access opening 503 in epitaxial layer 8 has formed only in the area of the opening at funnel-shaped end 61 of channel 60, as illustrated in FIG. 6*a*. Epitaxial layer 8 is closed in tapering area 62 of channel 60 as well as in the remaining diaphragm area, as illustrated in FIG. 6*b* and FIG. 6*c*.

Figure 7A:
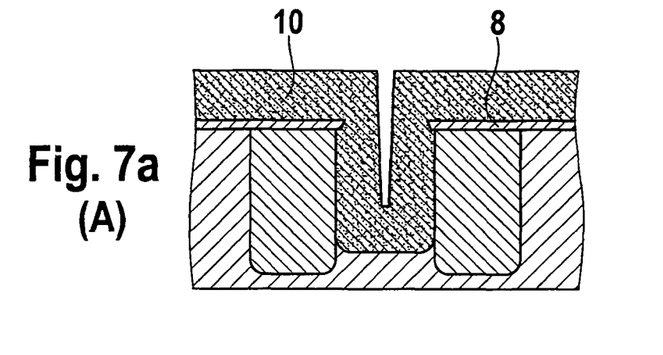
FIGS. 7a-7c each show a sectional representation of the component structure illustrated in FIG. 5 along sectional axes A, B and C, after the oxidation process.
Figure 7B:
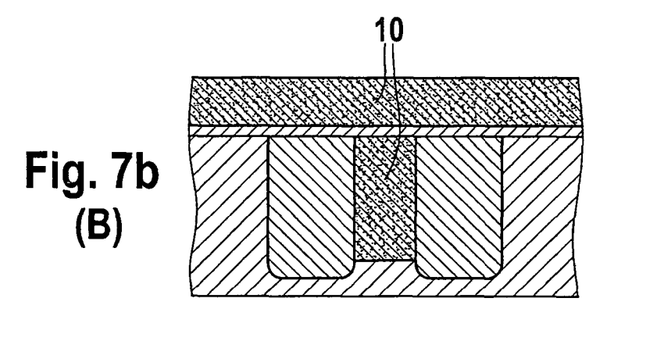
Figure 7C:
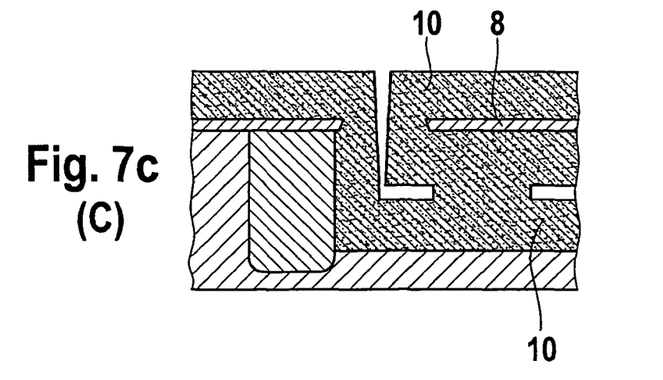

FIGS. 7*a* through 7*c* represent the situation after the oxidation process. Oxide 10 grows in a uniform layer thickness until channel 60 closes in tapering area 62, as illustrated in FIG. 7*b*. This prevents oxygen from being supplied to the cavity, so that no further oxide is able to grow in this location. However, further growth of oxide 10 is possible at funnel-shaped end 61 of channel 60, so that channel 60 closes completely over a large area, as illustrated in FIGS. 7*a* and 7*c*.

Figure 8A:
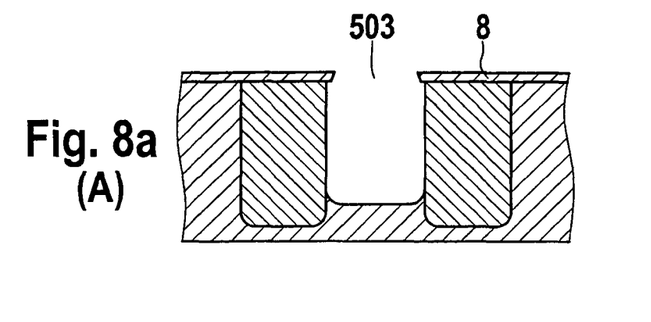
FIGS. 8a-8c each show a sectional representation of the component structure illustrated in FIG. 5 along sectional axes A, B and C, after the oxide layer has been removed from the surface.
Figure 8B:
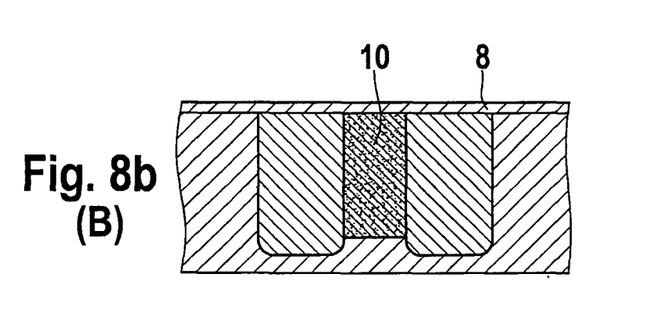
Figure 8C:
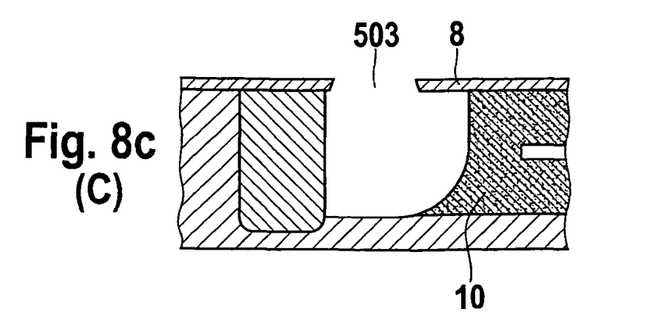

FIGS. 8*a* through 8*c* illustrate component structure 500 after superficial removal of oxide layer 10. A wet chemical etching process, gas phase etching or an anisotropic plasma etching process may be used for this purpose. The thickness of oxide layer 10 to be superficially etched is much smaller than the length of overgrown channel 60. In the exemplary embodiment illustrated here, only the oxide in the area of access opening 503 is removed during etching of oxide layer 10, while channel 60 remains closed.

Figure 9A:
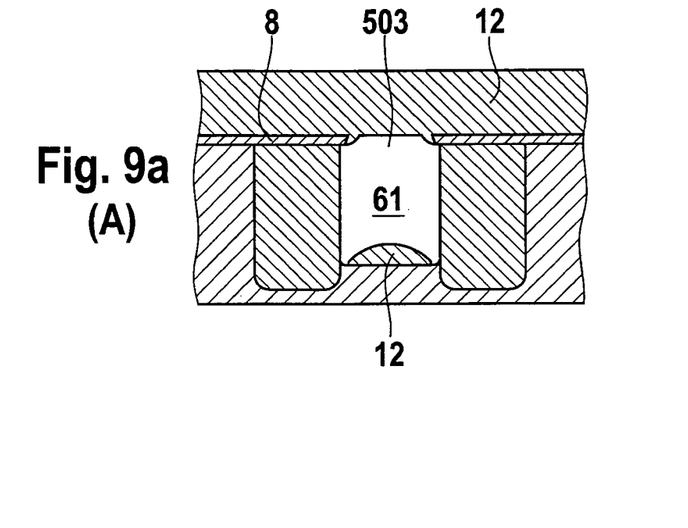
FIGS. 9a-9c each show a sectional representation of the component structure illustrated in FIG. 5 along sectional axes A, B and C, after a second epitaxial layer has been grown.
Figure 9B:
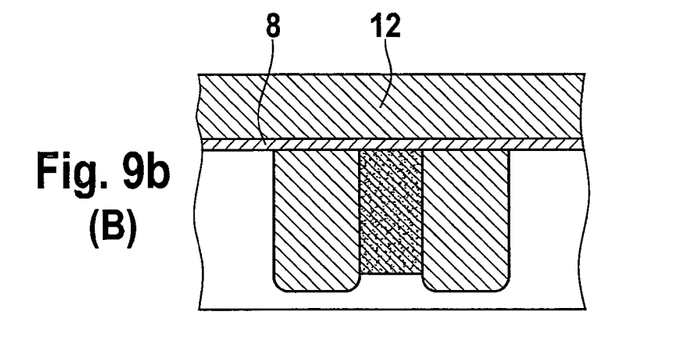
Figure 9C:
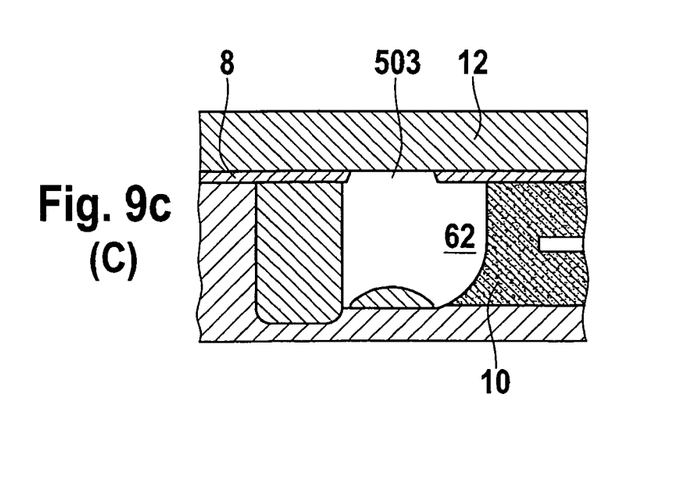

FIGS. 9*a* through 9*c* finally show component structure 500 after the growth of a second monocrystalline epitaxial layer 12, which completely covers not only the diaphragm area—see FIG. 9*c*—but also channel area 61, including access opening 503—see FIG. 9*a*—and channel area 62, as illustrated in FIG. 9*c*. Since oxide 10 has been removed in the entire area of access opening 503, epitaxial layer 12 was able to grow on the monocrystalline bottom of channel area 61 and on the side wall of access opening 503.

What is claimed is:

1. A method for manufacturing a micromechanical diaphragm structure having access from a rear of a p-doped silicon substrate, comprising:
   n-doping at least one contiguous lattice-type area of the substrate surface forming an n-doped lattice structure;
   porously etching a substrate area beneath the n-doped lattice structure;
   creating a cavity in the substrate area beneath the n-doped lattice structure; and
   growing a first monocrystalline silicon epitaxial layer on the n-doped lattice structure;
   wherein:
      at least one opening in the n-doped lattice structure is dimensioned in such a way that the at least one opening (i) is not closed by the growing first monocrystalline silicon epitaxial layer and (ii) forms at least one access opening to the cavity;
      an oxide layer is created on a cavity wall of the cavity;
      a rear access to the cavity is created, the oxide layer acting as an etch stop layer on the cavity wall; and
      the oxide layer is removed in an area of the cavity so that the rear access is produced for the micromechanical diaphragm structure provided above the cavity.

2. The method as recited in claim 1, wherein the oxide layer is created on the cavity wall by thermal oxidation, and wherein a supply of oxygen for the thermal oxidation is provided via the at least one access opening.

3. The method as recited in claim 2, wherein the thermal oxidation continues at least until the at least one access opening is closed.

4. The method as recited in claim 2, wherein the at least one access opening is closed by depositing on the first monocrystalline silicon epitaxial layer one of a dielectric, a polycrystalline or an epitaxial layer.

5. The method as recited in claim 4, wherein a further silicon epitaxial layer covering the closed at least one access opening is provided on the first monocrystalline silicon epitaxial layer.

6. The method as recited in claim 5, wherein process parameters for generating the further silicon epitaxial layer are selected in such a way that a polycrystalline area overgrown by monocrystalline silicon is produced above the closed at least one access opening.

7. The method as recited in claim 5, wherein process parameters for generating the further silicon epitaxial layer are selected in such a way that the closed at least one access opening is laterally overgrown by monocrystalline silicon, so that the further silicon epitaxial layer is universally monocrystalline.

8. The method as recited in claim 1, wherein the cavity and at least one channel emptying into the cavity are created beneath the n-doped lattice structure in the porously etched substrate area, and the at least one access opening is situated above the at least one channel in the n-doped lattice structure.

* * * * *

UNITED STATES PATENT AND TRADEMARK OFFICE
CERTIFICATE OF CORRECTION

PATENT NO.       : 8,519,494 B2                                           Page 1 of 1
APPLICATION NO. : 12/737037
DATED            : August 27, 2013
INVENTOR(S)      : Kramer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 255 days.

Signed and Sealed this

Fifteenth Day of September, 2015

Michelle K. Lee
*Director of the United States Patent and Trademark Office*